US011996761B2

(12) United States Patent
Yamaguchi et al.

(10) Patent No.: US 11,996,761 B2
(45) Date of Patent: May 28, 2024

(54) CURRENT DETECTION CIRCUIT AND LOAD DRIVE CONTROL DEVICE INCLUDING THE CIRCUIT

(71) Applicant: MAZDA MOTOR CORPORATION, Hiroshima (JP)

(72) Inventors: Tadao Yamaguchi, Hiroshima (JP); Masahito Sonehara, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 193 days.

(21) Appl. No.: 17/591,336

(22) Filed: Feb. 2, 2022

(65) Prior Publication Data

US 2022/0263400 A1  Aug. 18, 2022

(30) Foreign Application Priority Data

Feb. 18, 2021  (JP) ................. 2021-024535

(51) Int. Cl.
*H02M 3/158* (2006.01)
*G01R 19/25* (2006.01)
*H02M 1/00* (2006.01)
*H02M 1/08* (2006.01)

(52) U.S. Cl.
CPC .......... *H02M 1/0009* (2021.05); *G01R 19/25* (2013.01); *H02M 1/08* (2013.01); *H02M 3/158* (2013.01)

(58) Field of Classification Search
CPC .... H02M 1/0009; G01R 19/25; G01R 15/146
See application file for complete search history.

(56) References Cited

U.S. PATENT DOCUMENTS

| 2009/0102446 | A1* | 4/2009 | Takahashi | H02M 3/157 323/283 |
| 2009/0132188 | A1* | 5/2009 | Watanabe | G01R 31/2829 702/64 |
| 2010/0327979 | A1 | 12/2010 | Kanekawa et al. | |
| 2017/0212154 | A1 | 7/2017 | Otsuka et al. | |
| 2018/0109187 | A1* | 4/2018 | Eggermont | G01R 19/08 |
| 2018/0241298 | A1* | 8/2018 | Reinisch | H02M 3/156 |
| 2019/0238124 | A1* | 8/2019 | Tajima | H02M 3/158 |

FOREIGN PATENT DOCUMENTS

| JP | 5188465 B2 | 4/2013 |
| JP | 2017-129528 A | 7/2017 |

* cited by examiner

*Primary Examiner* — Alex Torres-Rivera
(74) *Attorney, Agent, or Firm* — Studebaker & Brackett PC (57) ABSTRACT

A current detection circuit includes: a detection resistor provided between an output of a driver circuit and a load; a power supply circuit configured to operate between a first power supply and a virtual ground potential, and generate a second power supply having a predetermined voltage difference from the virtual ground potential; and a signal processing circuit configured to operate between the second power supply and the virtual ground potential, and generate a detection signal corresponding to a voltage generated at the detection resistor. A virtual ground line for supplying the virtual ground potential is connected between the output of the driver circuit and the detection resistor.

6 Claims, 8 Drawing Sheets

SINGLE-ENDED AMPLIFIER

FULLY DIFFERENTIAL AMPLIFIER

FIG.5

CURRENT DETECTION CIRCUIT AND LOAD DRIVE CONTROL DEVICE INCLUDING THE CIRCUIT

CROSS-REFERENCE TO RELATED APPLICATION

This application claims priority to Japanese Patent Application No. 2021-024535 filed on Feb. 18, 2021, the entire disclosure of which is incorporated by reference herein.

BACKGROUND

The present disclosure belongs to the technical field related to a current detection circuit and a load drive control device including the current detection circuit.

A driver integrated circuit (a load drive control device) that outputs a drive current to a load (e.g., a solenoid valve) mounted on a vehicle is required to control the drive current to be constant with high accuracy. As a method of controlling the drive current, a technique has been known in which the drive current is detected using a detection resistor to and feedback control is performed based on the detected current. In this feedback control, detecting the drive current with high accuracy is significantly important.

Japanese Unexamined Patent Publication No. 2017-129528 (Patent Document 1) shows an electronic controller unit that controls current supply to a solenoid valve that controls the opening and closing of a clutch of an automobile based on the value of a current flowing through a detection resistor between the solenoid valve and a solenoid driver.

Japanese Patent No. 5188465 (Patent Document 2) shows the following example in Example 9 (see FIG. 16): A current detecting means is inserted into a phase current path; and a potential at the downstream end of the current detecting means is set to an analog system virtual ground potential of an amplification means (i.e., an amplifier) and an analog/digital conversion means (i.e., an AD converter) that are for detecting a current.

SUMMARY

Here, for example, in the configuration of FIG. 3 of Patent Document 1, the differential voltage of the sense resistor does not fluctuate largely. However, the voltage fluctuation is large in view of the absolute value of the voltage generated at the sense resistor. Thus, an input common-mode voltage (i.e., the average voltage between N1 and N3) fluctuates largely with respect to an output common-mode voltage (i.e., the average voltage between N2 and N4). Since the amplifier has a limited common-mode rejection ratio (CMRR), the common mode voltage fluctuation causes an amplification error which appears as an error in current detection.

According to Patent Document 2, the amplification means (i.e., the amplifier) and the analog/digital conversion means (i.e., the AD converter) are located in an area surrounded by an insulator layer formed on a silicon on insulator (SOI) substrate. However, the SOI process requires a special procedure and causes the problem of higher manufacturing costs.

In the configuration of FIG. 16 of Patent Document 2, a current flowing through circuits (e.g., an amplifier 12 and an analog/digital converter 13 of Patent Document 2) that operates between an analog power supply generated in a power supply circuit and an analog system virtual ground potential flows to a load without passing through the current detecting means. Since the current flowing to the load without passing through the current detecting means is not detected by the current detecting means, a detection error associated with that current occurs.

The present disclosure was made in view of the foregoing. It is an objective of the present disclosure to provide a technique of reducing current detection errors at a current detection circuit as much as possible without using any SOI process.

In order to achieve the objective, the present disclosure is directed to a current detection circuit for detecting a current output from a driver circuit to a load. The current detection circuit includes: a detection resistor provided between an output of the driver circuit and the load; a power supply circuit configured to operate between a first power supply and a virtual ground potential, and generate a second power supply having a predetermined voltage difference from the virtual ground potential; and a signal processing circuit configured to operate between the second power supply and the virtual ground potential, and generate a detection signal corresponding to a voltage generated at the detection resistor, wherein a virtual ground line for supplying the virtual ground potential is connected between the output of the driver circuit and the detection resistor.

According to this aspect, the power supply circuit operating between the first power supply and the virtual ground potential generates the second power supply so that the signal processing circuit operates between the second power supply and the virtual ground potential. Thus, amplification errors due to the common mode voltage fluctuations are less likely to occur. Moreover, since the virtual ground line is connected between the output of the driver circuit and the detection resistor, the current to be consumed by the signal processing circuit, in addition to the output current of the driver circuit, flows through the detection resistor. Accordingly, current detection errors can be reduced as compared to the technique disclosed in Patent Document 2.

In the current detection circuit, the power supply circuit may generate a third power supply in addition to the second power supply, the third power supply being divided from the second power supply and having a predetermined voltage difference from the virtual ground potential, and the signal processing circuit may include: an analog circuit configured to operate between the second power supply and the virtual ground potential; and a digital circuit configured to operate between the third power supply and the virtual ground potential.

In the current detection circuit, the power supply circuit may generate a third power supply in addition to the second power supply, the third power supply being divided from the second power supply and having a predetermined voltage difference from the virtual ground potential, and the signal processing circuit may include: an amplifier configured to amplify and output a voltage generated at the detection resistor; and an AD converter configured to convert an amplified output signal of the amplifier into a digital signal, a circuit that outputs consecutive values included in the amplifier and the AD converter may operate between the second power supply and the virtual ground potential, and a circuit that outputs discrete binary values included in the AD converter may operate between the third power supply and the virtual ground potential.

The power supply is divided into the second power supply and the third power supply to supply power to the analog circuit and the digital circuit, respectively. This configuration reduces the scales of the circuits to which power is supplied from the respective power supplies. Similarly, the power supply is divided into the second power supply and the third power supply to supply power to the circuit that outputs the consecutive values and the circuit that outputs the discrete binary values, respectively. This configuration reduces the scales of the circuits to which power is supplied from the respective power supplies. Accordingly, the capacitance added between the power supply and the fixed power supply decreases, which improves followability. That is, a devised circuit configuration can reduce the current detection errors of the current detection circuit without using any SOI process.

In the current detection circuit, the power supply circuit may include: a reference voltage generator configured to operate between the first power supply and the virtual ground potential, and generate a reference voltage; and a power supply divider configured to generate the second power supply and the third power supply based on the reference voltage, and the second power supply and the third power supply may be divided from each other at a position closer to the reference voltage generator than the signal processing circuit.

Accordingly, an influence (e.g., an influence of a resistance component) of a power supply line of another power supply on the second power supply and the third power supply can be reduced as much as possible.

Another aspect of the present disclosure is directed to a load drive control device. The device includes: a driver circuit configured to output a current to a load; the current detection circuit of any one of the above-mentioned aspects, configured to detect the current output from the driver circuit to the load; and a controller configured to output a control signal for driving the driver circuit based on a result of detection by the current detection circuit and a predetermined target current.

According to this aspect, similarly to the current detection circuit described above, amplification errors due to common mode voltage fluctuations are less likely to occur, and current detection errors can be reduced as compared to the technique disclosed in Patent Document 2.

As described above, the present disclosure provides a current detection circuit with current detection errors reduced as much as possible.

DETAILED DESCRIPTION

An exemplary embodiment will be described in detail below with reference to the drawings.

Figure 1:
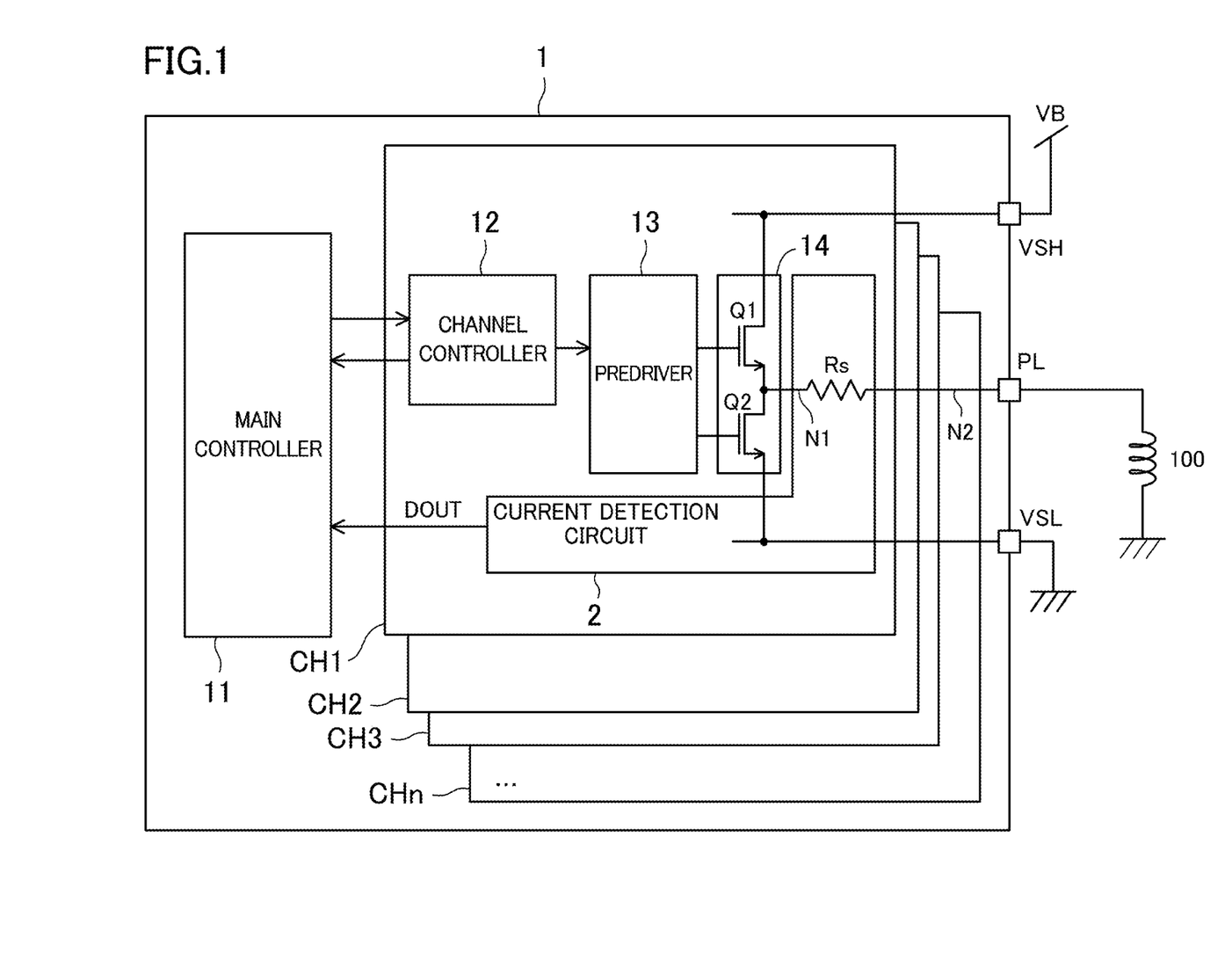
FIG. 1 shows a schematic configuration of a load drive control device (i.e., a driver IC) according to an embodiment.

FIG. 1 schematically shows a configuration of a driver integrated circuit (IC) 1 as a load drive control device according to this embodiment. The driver IC 1 is mounted on a vehicle, for example, and used to control the drive of a load (hereinafter simply referred to as a "load") such as an actuator mounted on the vehicle.

The driver IC 1 includes a plurality of driver channels CH1 to CHn, where n is an integer of two or more, and a main controller 11 that collectively controls the driver channels CH1 to CHn. In the following description, the driver channels CH1 to CHn will be described as a "driver channel CH" when not distinguished from each other.

FIG. 1 shows an example where a solenoid valve 100 for adjusting the hydraulic pressure of a transmission mounted on the vehicle is connected to an output terminal PL of the driver channel CH1. In this case, the solenoid valve 100 corresponds to the load to be controlled. The following description assumes that the solenoid valve 100 is a load. Note that the load is not limited to the solenoid valve 100 of the vehicle. For example, the present disclosure is applicable to actuator control in consumer equipment and/or industrial equipment, a high-voltage DC/DC converter, or the like.

The main controller 11 receives control information on a load, which is connected to each driver channel CH, from an electronic control unit (ECU, not shown) mounted on the vehicle. Based on the control information received from the ECU and a current detected by a current detection circuit 2, the main controller 11 provides each driver channel CH with control information for electrically controlling the load connected to the driver channel CH. The main controller 11 has the function of notifying, upon receipt of a signal indicating an anomaly from each driver channel, the ECU of the anomaly.

Each driver channel CH includes: a channel controller 12; a predriver 13; a driver circuit 14 for driving the solenoid valve 100 connected to the output terminal PL; and a current detection circuit 2 for detecting a current output from the driver circuit 14 to the solenoid valve 100. The channel controller 12 outputs, to the predriver 13, a control signal for controlling the driver circuit 14 based on the control information from the main controller 11 and the internal state of the channel. The predriver 13 drives the driver circuit 14 based on the control signal received from the channel controller 12. The channel controller 12 is an example of a controller that outputs a control signal for driving the driver circuit 14.

The driver circuit 14 includes a half bridge circuit comprised of an N-type high-side transistor Q1 and an N-type low-side transistor Q2 that are connected in series between a power supply terminal VSH and a ground terminal VSL. The power supply terminal VSH is connected to a battery (not shown) of the vehicle, for example, and is supplied with power VB from the battery. The ground terminal VSL is grounded to the ground of the vehicle, for example.

A connection line N1 connecting the high-side transistor Q1 and the low-side transistor Q2 is connected to one end of a detection resistor Rs. The other end of the detection resistor Rs is connected to the output terminal PL via a connection line N2.

The high-side transistor Q1 and the low-side transistor Q2 have gates to which drive signals are applied from the predriver 13, and are turned on and off so that the on-periods thereof do not overlap with each other. Accordingly, drive currents are supplied from the driver circuit 14 via the detection resistor Rs to the solenoid valve 100 to control the operation of the solenoid valve 100. Note that the configuration of the driver circuit 14 is not limited to that shown in FIG. 1, and may be another configuration.

<Current Detection Circuit>

Figure 2:
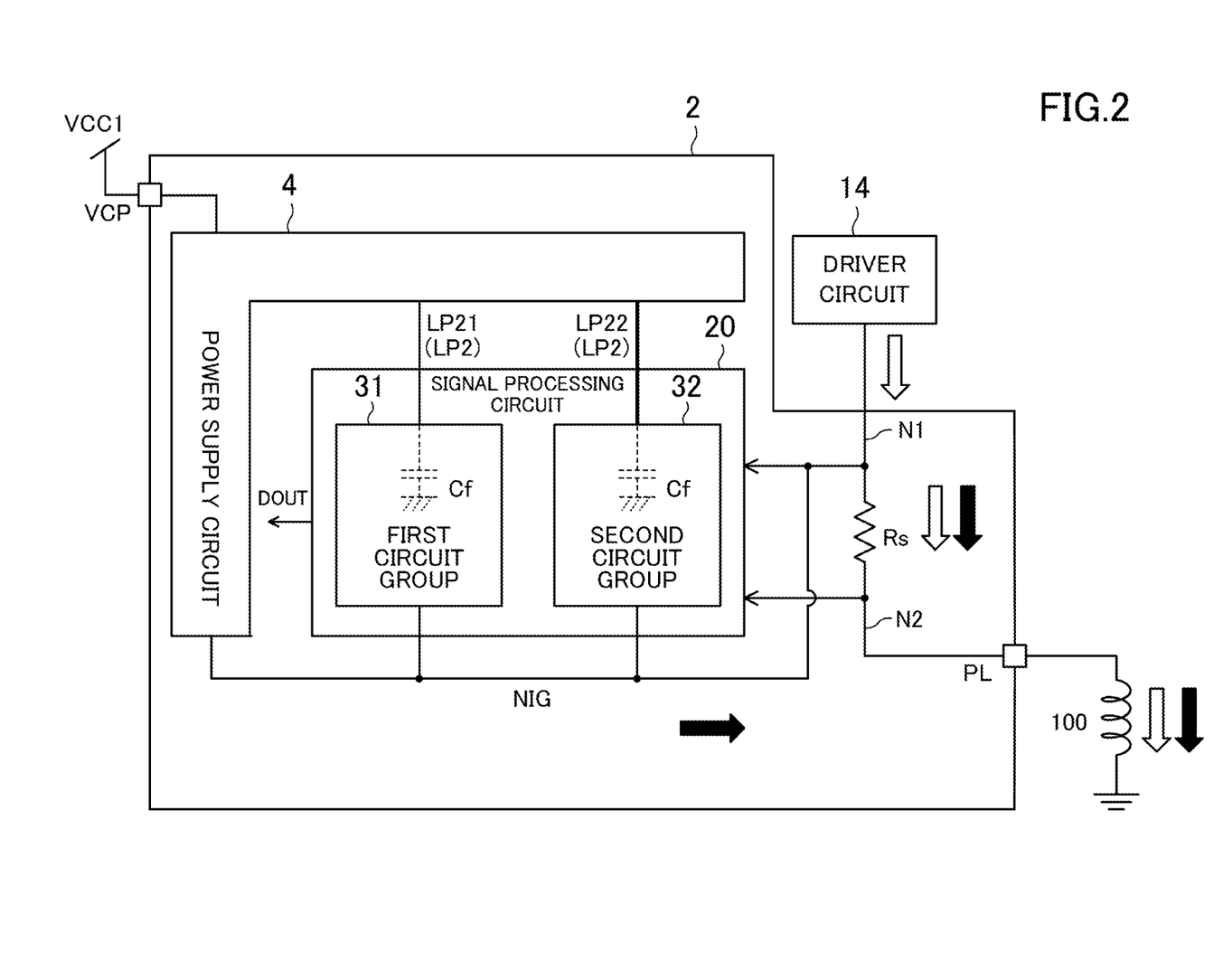
FIG. 2 is a block diagram schematically showing a configuration of a current detection circuit.

As shown in FIG. 2, the current detection circuit 2 includes the detection resistor Rs, a power supply circuit 4, and a signal processing circuit 20. The detection resistor Rs is interposed between the driver circuit 14 and the solenoid valve 100. The power supply circuit 4 operates between a power supply VCC1 supplied to the power supply terminal VCP and a virtual ground potential VIG. The signal processing circuit 20 generates a detection signal DOUT corresponding to a voltage generated at the detection resistor Rs. A virtual ground line NIG for supplying the virtual ground potential VIG is connected to the connection line N1 connecting the output of the driver circuit 14 and the detection resistor Rs.

The detection resistor Rs is for detecting the drive state of the solenoid valve 100 and performing feedback control.

The resistance value of the detection resistor Rs is set freely and is not particularly limited. For example, a difference voltage of 0.1 [V] is generated between two ends of the detection resistor where the detection resistor Rs has a resistance of 0.1 [Ω] and the driver circuit 14 outputs a current of 1 [A].

The power supply VCC1 is supplied to the power supply terminal VCP from a charge pump (not shown), for example. The voltage of the power supply terminal VCP is higher than the voltage of the power supply terminal VSH. The power supply VCC1 is an example of the "first power supply."

—Signal Processing Circuit—

The signal processing circuit 20 includes first and second circuit groups 31 and 32. The first circuit group 31 belongs to a circuit that outputs consecutive values and/or an analog circuit. The second circuit group 32 belongs to a circuit that outputs discrete binary values, such as HIGH/LOW, and/or a digital circuit.

The first circuit group 31 includes, for example, an amplifier 21, a switched capacitor 222, an integrator amplifier 223, and a current distribution circuit 27, which will be described later. Power supply nodes of the first circuit group 31 are each connected to a first power supply line LP21, and ground nodes thereof are each connected to the virtual ground line NIG. In other words, the first circuit group 31 operates between a system power supply VA2 (described later) supplied to the first power supply line LP21 and the virtual ground potential VIG.

The second circuit group 32 includes, for example, a control signal generator 221, a comparator 224, and a level shifter 25, which will be described later. Power supply nodes of the second circuit group 32 are each connected to a second power supply line LP22, and ground nodes of the second circuit group 32 are each connected to the virtual ground line NIG. In other words, the second circuit group 32 operates between a system power supply VA3, which will be described later, and the virtual ground potential VIG.

Now, a detailed configuration example of the current detection circuit 2 will be described more in detail with reference to FIGS. 2 and 3.

FIG. 3 (i.e., FIGS. 3A to 3D) shows a block configuration example of the current detection circuit 2, and a specific circuit configuration example of the power supply circuit 4. In the following description, FIGS. 3A to 3D are simply referred to as "FIG. 3" when not distinguished from each other (e.g., when a common circuit is described).

Figure 3A:
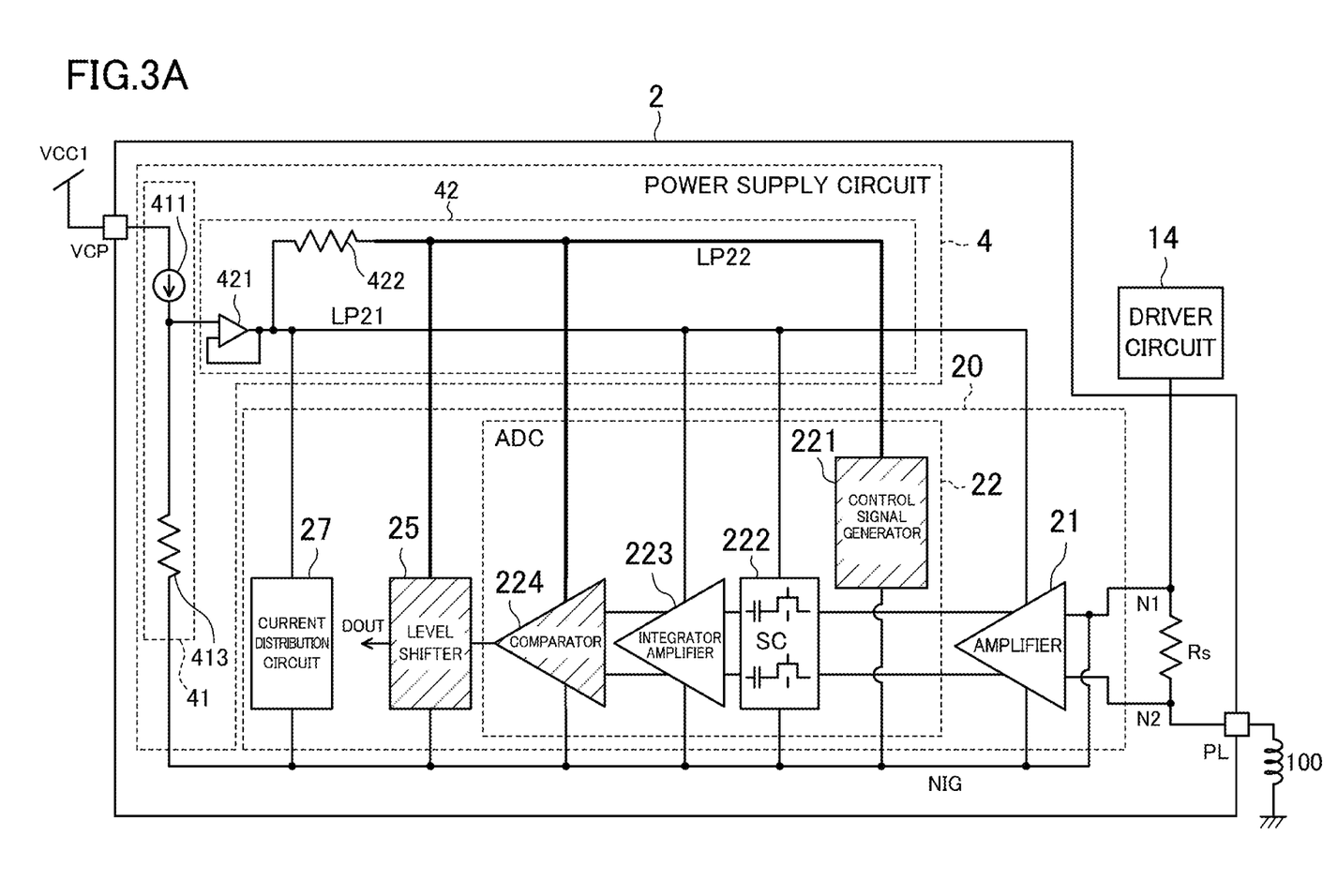
FIG. 3A shows an example block configuration of the current detection circuit and an example of a power supply circuit.
Figure 3B:
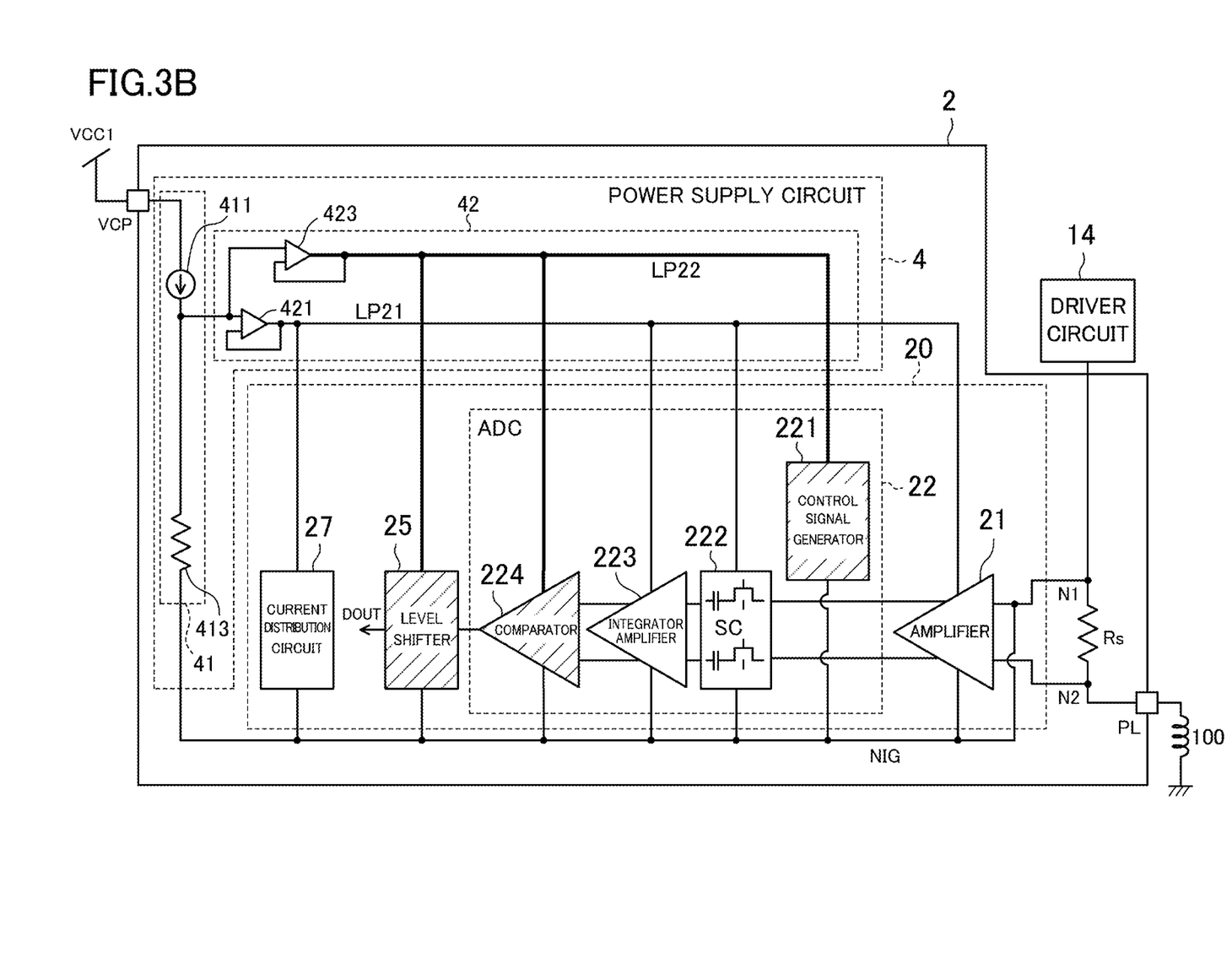
FIG. 3B shows an example block configuration of the current detection circuit and another example of the power supply circuit.
Figure 3C:
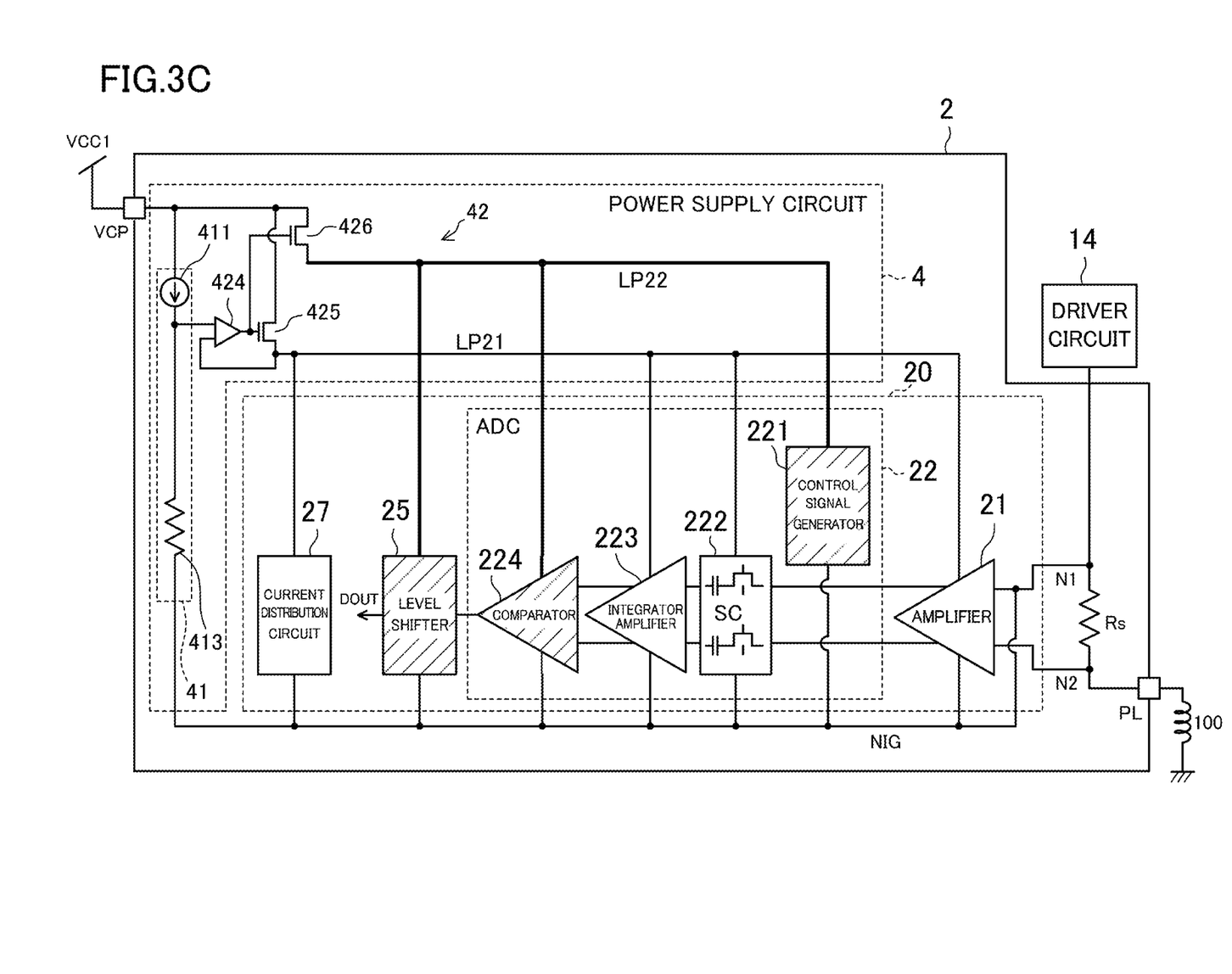
FIG. 3C shows an example block configuration of the current detection circuit and further another example of the power supply circuit.

In FIGS. 3A to 3C, the signal processing circuit 20 includes the amplifier 21, an AD converter 22, the level shifter 25, and the current distribution circuit 27. The amplifier 21 amplifies the voltages generated at the two ends of the detection resistor Rs. The AD converter 22 converts an output of the amplifier 21 into a digital signal.

—Amplifier—

Figure 3D:
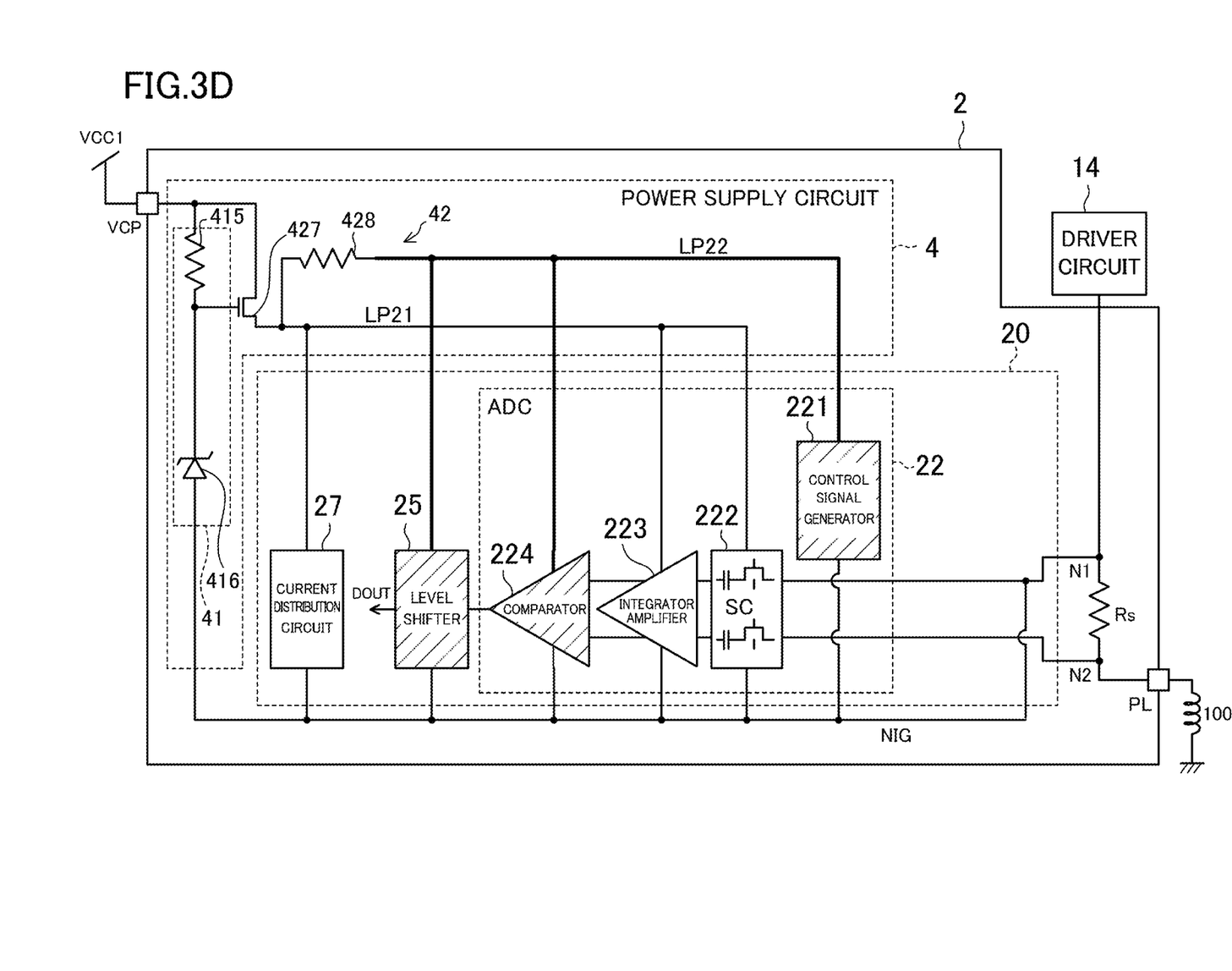
FIG. 3D shows an example block configuration of the current detection circuit and yet another example of the power supply circuit.

The amplifier 21 is a fully differential amplifier, for example, which operates between the system power supply VA2, which will be described later, and the virtual ground potential VIG, and amplifies and outputs a differential voltage generated between the two ends of the detection resistor Rs. That is, the connection line N1 connected to the upstream node of the detection resistor Rs and the connection line N2 connected to the downstream node of the detection resistor Rs are connected to the input of the amplifier 21. As shown in FIG. 3D, the signal processing circuit 20 may omit the amplifier 21. In this case, the connection lines N1 and N2 are directly connected to the AD converter 22.

Figure 4:
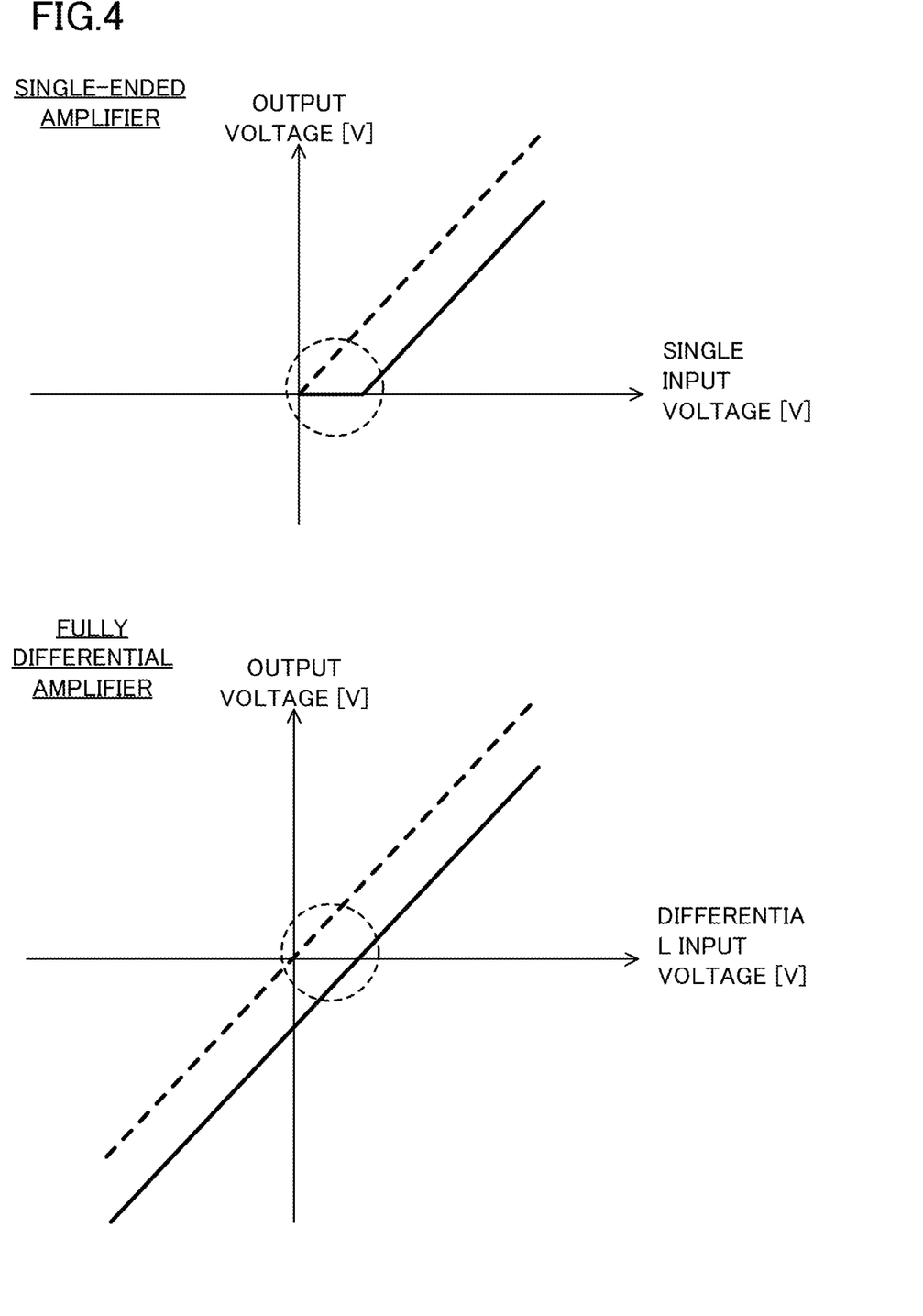
FIG. 4 illustrates a difference between a single-ended amplifier and a fully differential amplifier.

FIG. 4 illustrates a difference in the output voltage to the input voltage between a single-ended amplifier and a fully differential amplifier. In FIG. 4, the upper part shows the input and output characteristics of the single-ended amplifier, and the lower part shows the input and output characteristics of the fully differential amplifier. In each of the upper and lower parts of FIG. 4, the broken line indicates the ideal state where the input voltage is 0 [V] and the output voltage is 0 [V]. In this ideal state, the output voltage changes linearly with respect to the input voltage in the range where the input voltage is 0 [V] or more in each of the single-ended and fully differential amplifiers.

Here, in this embodiment, since the connection line N1 has the virtual ground potential VIG, a negative potential with respect to the virtual ground potential is input to the amplifier 21. With an increase in the absolute value of the negative potential, the problem of a breakdown voltage may occur. To deal with this problem, for example, the resistance value of the detection resistor Rs is adjusted so that the absolute value of the negative potential is reduced to 300 [mV] at the maximum or less, for example, in one preferred embodiment. At this time, in the use of a single-ended amplifier, a dead zone may occur when a small potential is input, as in the area surrounded by the broken circle in the upper part of FIG. 4. By contrast, the fully differential amplifier can cope with a small input potential around 0 [V] (see the lower part of FIG. 4). Accordingly, even if a small potential about 0 [V] is input to the amplifier, an amplified signal (e.g., an analog detection signal) accurately amplified in accordance with the voltages at the two ends of the detection resistor Rs is input to the AD converter 22 at the subsequent stage.

—AD Converter—

FIG. 3 shows an example where the AD converter 22 is a switched capacitor delta-sigma (ΔΣ) modulator (DSM). The ΔΣ modulator is a fully differential modulator, for example.

Specifically, in the AD converter 22, the switched capacitor 222 samples an analog detection signal output from the amplifier 21. The voltage sampled by the switched capacitor 222 is integrated by the integrator amplifier 223, and is compared with a reference voltage at the comparator 224 in terms of the magnitude to be converted into a pulse train.

The output of the comparator 224 is then, in the level shifter 25, converted into a signal level corresponding to the main controller 11 at the subsequent stage, and is output as a detection signal DOUT. The control signal generator 221 is a block that generates a control signal for controlling the AD converter 22. The current distribution circuit 27 is a circuit that generates a current for the level shifter 25.

—Power Supply Circuit—

As a configuration commonly shown in FIGS. 3A to 3D, the power supply circuit 4 includes a reference voltage generator 41 and a power supply divider 42. The reference voltage generator 41 operates between the power supply VCC1 and the virtual ground potential VIG, and generates a reference voltage (hereinafter referred to as a "reference voltage VA1"). The power supply divider 42 generates the system power supply VA2 and the system power supply VA3 divided from each other based on the reference voltage VA1. The system power supply VA2 is an example of the "second power supply", and the system power supply VA3 is an example of the "third power supply." When the driver circuit 14 controls a current flowing through the solenoid valve 100, the virtual ground potential VIG fluctuates. Accordingly, since the reference voltage VA1 having a predetermined voltage difference from the virtual ground potential VIG fluctuates, the power supply generated from the reference voltage VA1 also fluctuates in accordance with the fluctuation in the reference voltage VA1.

As shown in FIG. 2, power from the system power supply VA2, which is one of the system power supplies generated by the power supply divider 42, is supplied to the first circuit group 31 via the first power supply line LP21, whereas power from the other system power supply VA3 is supplied to the second circuit group 32 via the second power supply line LP22. In FIG. 3, in the signal processing circuit 20, the circuits belonging to the first circuit group 31 are represented by white boxes, whereas the circuits belonging to the second circuit group 32 are represented by hatched boxes.

As described above, in the power supply circuit 4, the system power supply VA2 supplied to the first circuit group 31 and the system power supply VA3 supplied to the second circuit group 32 are divided from each other, thereby making it possible to reduce the influence of the parasitic capacitance Cf (indicated by broken lines in the figure) between each power supply and a fixed voltage (a substrate). In particular, it is important to increase the followability to fluctuations of the power supply supplied to the first circuit group 31.

More specifically, in a case in which the signal processing circuit includes an analog circuit and a digital circuit, and those circuits are operated with power from a single power supply output from the power supply circuit, the capacitance added between the power supply and a fixed power supply may increase depending on the scales and/or configurations of the circuits. The concerns about an increase in the capacitance described above are reduced by using an SOI process. However, as mentioned above, the SOI process requires a special procedure and causes the problem of higher manufacturing costs. To address this, in the power supply circuit 4, the power supply is divided into the system power supplies VA2 and VA3, and power is supplied to the first circuit group 31 and the second circuit group 32 from the respective power supplies. This configuration reduces the scales of the circuits to which power is supplied from the respective power supplies. Accordingly, the capacitance added between the power supply and the fixed power supply decreases, which improves followability.

Now, a more specific configuration will be described with reference to FIGS. 3A to 3D.

(Configuration Shown in FIG. 3A)

The reference voltage generator 41 is comprised of a current source 411 and a resistor 413 that are connected in series between the power supply terminal VCP and the virtual ground line NIG. The reference voltage VA1 is output from a node between the current source 411 and the resistor 413.

The power supply divider 42 includes a voltage follower circuit 421 that has one input connected to the node between the current source 411 and the resistor 413, and generates the system power supply VA2 from the reference voltage VA1. The output of the voltage follower circuit 421 is connected to the first power supply line LP21 for supplying power from the system power supply VA2, and the other input of the voltage follower circuit 421.

The first power supply line LP21 is connected to the power supply nodes of the amplifier 21, the switched capacitor 222, the integrator amplifier 223, and the current distribution circuit 27 belonging to the first circuit group 31.

The power supply divider 42 includes a separating resistance 422 in the second power supply line LP22 branched from the first power supply line LP21. The separating resistance 422 separates the second power supply line LP22 from the first power supply line LP21. Accordingly, the power supply divider 42 generates the system power supply VA3 divided from the system power supply VA2 and having a predetermined voltage difference from the virtual ground potential VIG.

The second power supply line LP22 is branched at a root point of the first power supply line LP21 close to the power supply circuit 4. The separating resistance 422 is arranged close to a branch point of the second power supply line LP22 from the first power supply line LP21. In other words, the branch point between the first and second power supply lines LP21 and LP22 is closer to the power supply circuit 4 than the signal processing circuit 20. The separating resistance 422 is closer to the branch point than the signal processing circuit 20. This configuration reduces common resistance components between the first and second power supply lines LP21 and LP22.

The power supply circuit 4 supplies power output from the voltage follower circuit 421 as it is via the first power supply line LP21 to the first circuit group 31 of "higher importance" requiring a relatively high accuracy (e.g., a circuit that outputs consecutive values). Accordingly, the influence of the second circuit group 32 on the first circuit group 31 can be reduced, and more stable power with good followability can be supplied to the first circuit group 31 of higher importance.

On the other hand, the power supply circuit 4 supplies power from the system power supply VA3 via the second power supply line LP22, which is branched and separated from the first power supply line LP21 by the separating resistance 422, to the second circuit group 32 of "lower importance" requiring relatively not so much high accuracy (e.g., a circuit that outputs discrete values such as HIGH and LOW).

(Configuration Shown in FIG. 3B)

The reference voltage generator 41 has the same configuration as in FIG. 3A. A description thereof is omitted here.

The power supply divider 42 includes voltage follower circuits 421 and 423. The voltage follower circuit 421 has one input connected to the node between the current source 411 and the resistor 413, and generates the system power supply VA2 from the reference voltage VA1. The voltage follower circuit 423 has one input connected to the node between the current source 411 and the resistor 413, and generates the system power supply VA3 from the reference voltage VA1.

The output of the voltage follower circuit 421 is connected to the first power supply line LP21 for supplying power from the system power supply VA2, and the other input of the voltage follower circuit 421.

The output of the voltage follower circuit 423 is connected to the second power supply line LP22 for supplying power from the system power supply VA3, and the other input of the voltage follower circuit 423.

Accordingly, in FIG. 3B as well, the power supply divider 42 generates the system power supply VA2 and the system power supply VA3 divided from each other based on the reference voltage and having predetermined voltage differences from the virtual ground potential VIG.

(Configuration Shown in FIG. 3C)

The reference voltage generator 41 has the same configuration as in FIG. 3A. A description thereof is omitted here.

The power supply divider 42 includes a voltage follower circuit 424 and N-type transistors 425 and 426. The voltage follower circuit 424 has one input connected to the node between the current source 411 and the resistor 413. The N-type transistor 425 is interposed between the power supply terminal VCP and the first power supply line LP21. The N-type transistor 426 is interposed between the power supply terminal VCP and the second power supply line LP22. Each of the transistors 425 and 426 has a gate connected to the output of the voltage follower circuit 424. The first power supply line LP21 (i.e., the source of the transistor 425) is connected to the other input of the voltage follower circuit 424.

Accordingly, in FIG. 3C as well, the power supply divider 42 generates the system power supply VA2 and the system power supply VA3 divided from each other based on the reference voltage and having predetermined voltage differences from the virtual ground potential.

(Configuration Shown in FIG. 3D)

The reference voltage generator 41 is comprised of a resistor 415 and a Zener diode 416 connected in series between the power supply terminal VCP and the virtual ground line NIG. The reference voltage VA1 is output from a node between the resistor 415 and the Zener diode 416.

The power supply divider 42 includes an N-type transistor 427 and a separating resistance 428. The N-type transistor 427 is interposed between the power supply terminal VCP and the first power supply line LP21. The separating resistance 428 is located in the second power supply line LP22 branched from the first power supply line LP21, and separates the second power supply line LP22 from the first power supply line LP21.

Accordingly, in FIG. 3D as well, the power supply divider 42 generates the system power supply VA2 and the system power supply VA3 divided from each other based on the reference voltage and having predetermined voltage differences from the virtual ground potential.

As in FIG. 3A, the branch point between the first and second power supply lines LP21 and LP22 is closer to the power supply circuit 4 than the signal processing circuit 20. The separating resistance 428 is closer to the branch point than the signal processing circuit 20. This configuration reduces common resistance components between the first and second power supply lines LP21 and LP22.

Note that the configuration of the power supply circuit 4 is not particularly limited and may be a configuration other than those shown in FIGS. 3A to 3D. Although not shown, for example, the power supply divider 42 may generate three or more system power supplies divided from one another and supplied to different circuits.

As described above, in the current detection circuit 2 shown in FIG. 3, the connection line N1 connecting the output of the driver circuit 14 and the detection resistor Rs is connected to the virtual ground line NIG; the first circuit group 31 operates between the system power supply VA2 and the virtual ground potential VIG; and the second circuit group 32 operates between the system power supply VA3 and the virtual ground potential VIG. This configuration reduces the difference in the average voltage between the input and output stages of the amplifier 21 as compared to the typical configuration described in as Patent Document 1. It is therefore possible to reduce current detection errors caused by a common mode voltage fluctuations.

In addition to the output current of the driver circuit 14, the current to be consumed by the amplifier 21 and the AD converter 22 also flows through the detection resistor Rs. Accordingly, more accurate current detection compared to the background art (e.g., Patent Document 2) is achieved.

In this embodiment, in the power supply circuit 4, an internal analog power supply VA is divided into two system power supplies to distribute and supply power from the respective system power supplies in accordance with the types of the circuits. This configuration can reduce the capacitance added between each power supply and a fixed voltage, which makes it possible to reduce detection errors by the current detection circuit 2 as much as possible without using any expensive process such as circuit division by a silicon on insulator (SOI) substrate.

Note that a decrease in the parasitic capacitance of a power supply can increase the followability to power supply fluctuations. According to this embodiment, when the driver circuit 14 controls a current flowing through the solenoid valve 100, fluctuations of the virtual ground potential VIG causes fluctuations of the internal analog power supply VA. Thus, higher followability to the power supply fluctuations is very important to reduce current detection errors.

(Variation)

In the example of FIG. 3, the power supply divider 42 generates the system power supply VA2 and the system power supply VA3 divided from each other based on the reference voltage. The configuration is, however, not limited thereto. For example, as shown in FIG. 5, the system power supply VA2 generated by the power supply divider 42 may be supplied to both the first and second circuit groups 31 and 32 of the signal processing circuit 20.

Figure 5:
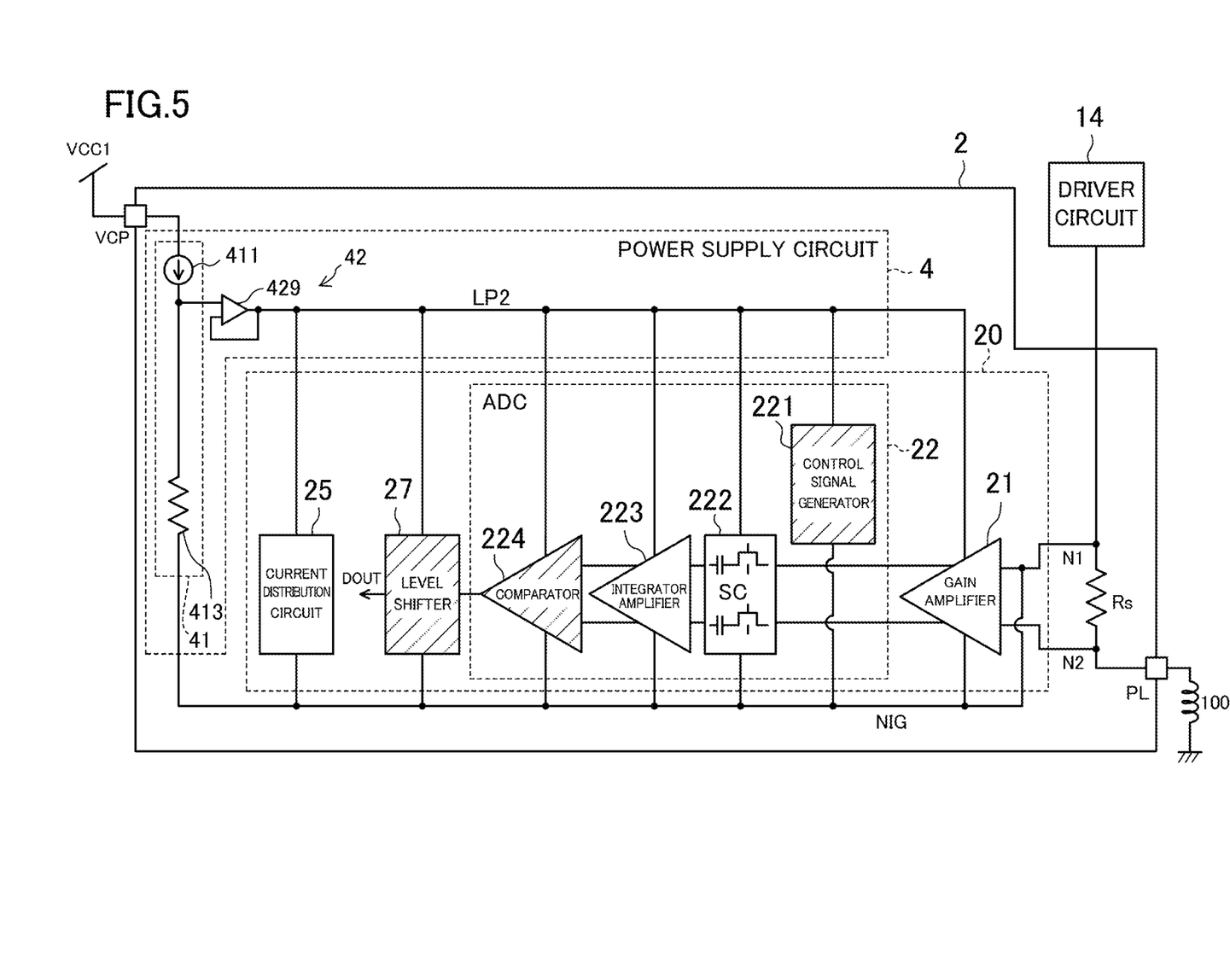
FIG. 5 shows an example block configuration of a current detection circuit and an example of a power supply circuit.

More specifically, the power supply circuit 4 shown in FIG. 5 includes the reference voltage generator 41 and the power supply divider 42. The reference voltage generator 41 has the same configuration as in FIG. 3A. A description thereof is omitted here.

The power supply divider 42 includes a voltage follower circuit 429 with one input connected to the node between the current source 411 and the resistor 413. The output of the voltage follower circuit 429 is connected to a power supply line LP2 for supplying an internal analog power supply VA, and the other input of the voltage follower circuit 429. Power from this internal analog power supply VA is supplied to the first and second circuit groups 31 and 32 of the signal processing circuit 20. That is, the power supply circuit 4 supplies power from the internal analog power supply VA to the signal processing circuit 20, that is, the amplifier 21, the AD converter 22, the level shifter 25, and the current distribution circuit 27.

Similarly to the configuration in FIG. 3, in the current detection circuit 2 shown in FIG. 5, as well, the connection line N1 connecting the output of the driver circuit 14 and the detection resistor Rs is connected to the virtual ground line NIG, and the signal processing circuit 20 operates between the internal analog power supply VA and the virtual ground potential VIG. This configuration reduces the difference in the average voltage between the input and output stages of the amplifier 21 as compared to the typical configuration described in as Patent Document 1. It is therefore possible to reduce current detection errors caused by a common mode voltage fluctuations.

In addition to the output current of the driver circuit 14, the current to be consumed by the amplifier 21 and the AD converter 22 also flows through the detection resistor Rs. Accordingly, more accurate current detection compared to the background art (e.g., Patent Document 2) is achieved.

To sum up, the driver IC according to the present disclosure includes the driver circuit 14, the current detection circuit 2, and the channel controller 12. The driver circuit 14 outputs a current to the solenoid valve 100. The current detection circuit 2 detects the current output from the driver circuit 14 to the solenoid valve 100. The channel controller 12 outputs a control signal for driving the driver circuit 14 based on a result of detection by the current detection circuit 2 and a predetermined target current.

The current detection circuit 2 includes the detection resistor Rs, the power supply circuit, and the signal processing circuit 20. The detection resistor Rs is arranged between the output of the driver circuit 14 and the solenoid valve 100. The power supply circuit operates between the power supply VCC1 and the virtual ground potential VIG and generates a second power supply (the system power supplies VA2 and VA3 or the internal analog power supply VA) having a predetermined voltage difference from the virtual ground potential VIG. The signal processing circuit 20 operates between the second power supply and the virtual ground potential VIG and generates a detection signal corresponding to the voltage generated at the detection resistor Rs. A virtual ground line NIG for supplying the virtual ground potential VIG is connected between the output of the driver circuit 14 and the detection resistor Rs.

This configuration reduces the difference in the average voltage between the input and output stages of the amplifier 21 as compared to the typical configuration described in as Patent Document 1. It is therefore possible to reduce current detection errors caused by a common mode voltage fluctuations.

In addition to the output current of the driver circuit 14, the current to be consumed by the amplifier 21 and the AD converter 22 also flows through the detection resistor Rs. Accordingly, more accurate current detection compared to the background art (e.g., Patent Document 2) is achieved.

The embodiment described above is merely an example in nature, and the scope of the present disclosure should not be interpreted in a limited manner. The scope of the present disclosure is defined by the appended claims. All modifications, replacements, additions, and omissions belonging to a range equivalent to the claims fall within the scope of the present disclosure. For example, circuits and configurations shown in different ones of the drawings described above in the embodiment may be combined as appropriate to form another embodiment, which provides the same or similar advantages.

INDUSTRIAL APPLICABILITY

The present disclosure reduces current detection errors without using any SOI process in a current detection circuit and a load drive control device including the current detection circuit, and is thus significantly useful.

What is claimed is:

1. A current detection circuit for detecting a current output from a driver circuit to a load, the current detection circuit comprising:
   a detection resistor provided between an output of the driver circuit and the load;
   a power supply circuit configured to operate between a first power supply and a virtual ground potential, and generate a second power supply having a predetermined voltage difference from the virtual ground potential; and
   a signal processing circuit configured to operate between the second power supply and the virtual ground potential, and generate a detection signal corresponding to a voltage generated at the detection resistor, wherein
   a virtual ground line for supplying the virtual ground potential is connected between the output of the driver circuit and the detection resistor,
   the power supply circuit generates a third power supply in addition to the second power supply, the third power supply being divided from the second power supply and having a predetermined voltage difference from the virtual ground potential,
   the signal processing circuit includes: an analog circuit configured to operate between the second power supply and the virtual ground potential; and a digital circuit configured to operate between the third power supply and the virtual ground potential,
   the power supply circuit includes: a reference voltage generator configured to operate between the first power supply and the virtual ground potential, and generate a reference voltage; and a power supply divider configured to generate the second power supply and the third power supply based on the reference voltage, and
   the second power supply and the third power supply are divided from each other at a position closer to the reference voltage generator than the signal processing circuit.

2. A load drive control device comprising:
   the driver circuit configured to output the current to the load;
   the current detection circuit of claim 1, configured to detect the current output from the driver circuit to the load; and
   a controller configured to output a control signal for driving the driver circuit based on a result of detection by the current detection circuit and a predetermined target current.

3. A current detection circuit for detecting a current output from a driver circuit to a load, the current detection circuit comprising:
   a detection resistor provided between an output of the driver circuit and the load;
   a power supply circuit configured to operate between a first power supply and a virtual ground potential, and generate a second power supply having a predetermined voltage difference from the virtual ground potential; and
   a signal processing circuit configured to operate between the second power supply and the virtual ground potential, and generate a detection signal corresponding to a voltage generated at the detection resistor, wherein
   a virtual ground line for supplying the virtual ground potential is connected between the output of the driver circuit and the detection resistor, the power supply circuit generates a third power supply in addition to the second power supply, the third power supply being divided from the second power supply and having a predetermined voltage difference from the virtual ground potential, and the signal processing circuit includes: an amplifier configured to amplify and output a voltage generated at the detection resistor; and an analog to digital (AD) converter configured to convert an amplified output signal of the amplifier into a digital signal, a circuit that outputs consecutive values included in the amplifier and the AD converter operates between the second power supply and the virtual ground potential, and a circuit that outputs discrete binary values included in the AD converter operates between the third power supply and the virtual ground potential.

4. The current detection circuit of claim 3, wherein the power supply circuit includes: a reference voltage generator configured to operate between the first power supply and the virtual ground potential, and generate a reference voltage; and a power supply divider configured to generate the second power supply and the third power supply based on the reference voltage, and the second power supply and the third power supply are divided from each other at a position closer to the reference voltage generator than the signal processing circuit.

5. A load drive control device comprising:

the driver circuit configured to output the current to the load;

the current detection circuit of claim 4, configured to detect the current output from the driver circuit to the load; and a controller configured to output a control signal for driving the driver circuit based on a result of detection by the current detection circuit and a predetermined target current.

6. A load drive control device comprising:

the driver circuit configured to output the current to the load;

the current detection circuit of claim 3, configured to detect the current output from the driver circuit to the load; and a controller configured to output a control signal for driving the driver circuit based on a result of detection by the current detection circuit and a predetermined target current.

\* \* \* \* \*